(12) United States Patent
Tamura et al.

(10) Patent No.: US 7,737,519 B2
(45) Date of Patent: Jun. 15, 2010

(54) PHOTOELECTRIC CONVERSION DEVICE AND MANUFACTURING METHOD THEREOF

(75) Inventors: Seiichi Tamura, Yokohama (JP); Hiroshi Yuzurihara, Atsugi (JP); Takeshi Ichikawa, Hachioji (JP); Ryuichi Mishima, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 10/599,427

(22) PCT Filed: Apr. 27, 2005

(86) PCT No.: PCT/JP2005/008467

§ 371 (c)(1),
(2), (4) Date: Sep. 28, 2006

(87) PCT Pub. No.: WO2005/109512

PCT Pub. Date: Nov. 17, 2005

(65) Prior Publication Data

US 2008/0036019 A1    Feb. 14, 2008

(30) Foreign Application Priority Data

May 6, 2004   (JP) .............................. 2004-137411

(51) Int. Cl.
*H01L 31/068* (2006.01)
(52) U.S. Cl. ...................... 257/446; 257/292; 257/348; 257/E27.132; 257/E27.133
(58) Field of Classification Search .................. 257/215, 257/E27.132, E27.113, E29.146, 446, 292, 257/348, E27.133; 438/59, 234

See application file for complete search history.

(56) References Cited

U.S. PATENT DOCUMENTS

| 4,148,048 | A | * | 4/1979 | Takemoto et al. ........... 257/292 |
| 4,791,070 | A | * | 12/1988 | Hirao et al. ................... 438/59 |
| 5,141,882 | A | | 8/1992 | Komori et al. ................ 437/34 |
| 5,201,681 | A | | 4/1993 | Okunuki et al. .............. 445/24 |
| 5,361,015 | A | | 11/1994 | Okunuki et al. ............. 313/309 |
| 5,428,237 | A | | 6/1995 | Yuzurihara et al. .......... 257/349 |
| 5,466,961 | A | | 11/1995 | Kikuchi et al. .............. 257/379 |

(Continued)

FOREIGN PATENT DOCUMENTS

JP    53-122316    10/1978

(Continued)

*Primary Examiner*—Zandra Smith
*Assistant Examiner*—Tsz K Chiu
(74) *Attorney, Agent, or Firm*—Fitzpatrick, Cella, Harper & Scinto (57) ABSTRACT

The present invention, in a photoelectric conversion device in which a pixel including a photoelectric conversion device for converting a light into a signal charge and a peripheral circuit including a circuit for processing the signal charge outside a pixel region in which the pixel are disposed on the same substrate, comprising: a first semiconductor region of a first conductivity type for forming the photoelectric region, the first semiconductor region being formed in a second semiconductor region of a second conductivity type; and a third semiconductor region of the first conductivity type and a fourth semiconductor region of the second conductivity type for forming the peripheral circuit, the third and fourth semiconductor regions being formed in the second semiconductor region; wherein in that the impurity concentration of the first semiconductor region is higher than the impurity concentration of the third semiconductor region.

1 Claim, 12 Drawing Sheets

U.S. PATENT DOCUMENTS

| | | | |
|---|---|---|---|
| 5,561,317 A | 10/1996 | Momma et al. | 257/620 |
| 5,598,037 A | 1/1997 | Kikuchi et al. | 257/773 |
| 5,612,230 A | 3/1997 | Yuzurihara et al. | 437/21 |
| 5,693,959 A | 12/1997 | Inoue et al. | 357/66 |
| 5,700,719 A | 12/1997 | Yuzurihara et al. | 437/193 |
| 5,731,131 A | 3/1998 | Momma et al. | 430/311 |
| 5,903,043 A | 5/1999 | Ichikawa et al. | 257/532 |
| 5,918,115 A | 6/1999 | Kikuchi et al. | 438/138 |
| 6,049,235 A | 4/2000 | Ichikawa et al. | 327/51 |
| 6,373,099 B1 | 4/2002 | Kikuchi et al. | 257/331 |
| 6,445,014 B1 | 9/2002 | Rhodes et al. | 257/185 |
| 7,030,918 B1 | 4/2006 | Nakashiba | 348/294 |
| 2001/0000068 A1* | 3/2001 | Isogai et al. | 257/443 |
| 2001/0032983 A1 | 10/2001 | Miyagawa et al. | 257/79 |
| 2002/0024071 A1 | 2/2002 | Kawajiri et al. | 257/292 |
| 2002/0036303 A1 | 3/2002 | Ohkubo | 257/215 |
| 2005/0067640 A1* | 3/2005 | Ohkawa | 257/291 |
| 2005/0127415 A1 | 6/2005 | Yuzurihara et al. | 257/292 |

FOREIGN PATENT DOCUMENTS

| | | |
|---|---|---|
| JP | 59-034657 A | 2/1984 |
| JP | 1-243462 A | 9/1989 |
| JP | 02-264464 | 10/1990 |
| JP | 4-284625 A | 10/1992 |
| JP | 8-213582 A | 8/1996 |
| JP | 10-098176 A | 4/1998 |
| JP | 2000-232214 | 8/2000 |
| JP | 2001-015725 A | 1/2001 |
| JP | 2001-332714 | 11/2001 |
| JP | 2002-110955 A | 4/2002 |
| JP | 2002-164527 A | 6/2002 |
| JP | 2005-191362 A | 7/2005 |

\* cited by examiner

PHOTOELECTRIC CONVERSION DEVICE AND MANUFACTURING METHOD THEREOF

FIELD OF THE INVENTION

The present invention relates to a photoelectric conversion device, and more particularly, to a MOS type photoelectric conversion device and a manufacturing method thereof.

BACKGROUND OF THE INVENTION

In recent years, in general, a photoelectric conversion device has been used as the solid state image-pick up device of a two-dimensional image input device centering on a digital still camera and a video camera recorder or has been utilized as a one-dimensional image reading device centering on a facsimile and a scanner, and has been much in rapid demand.

As the photoelectric conversion device, a CCD (Charge Coupled Device) or MOS type sensor has been used. As a representative of the MOS type sensor, a CMOS photoelectric conversion device (hereinafter referred to as "CMOS sensor") has been put to practical use (see Japanese Patent Application Laid-Open No. 2001-332714).

Figure 7:
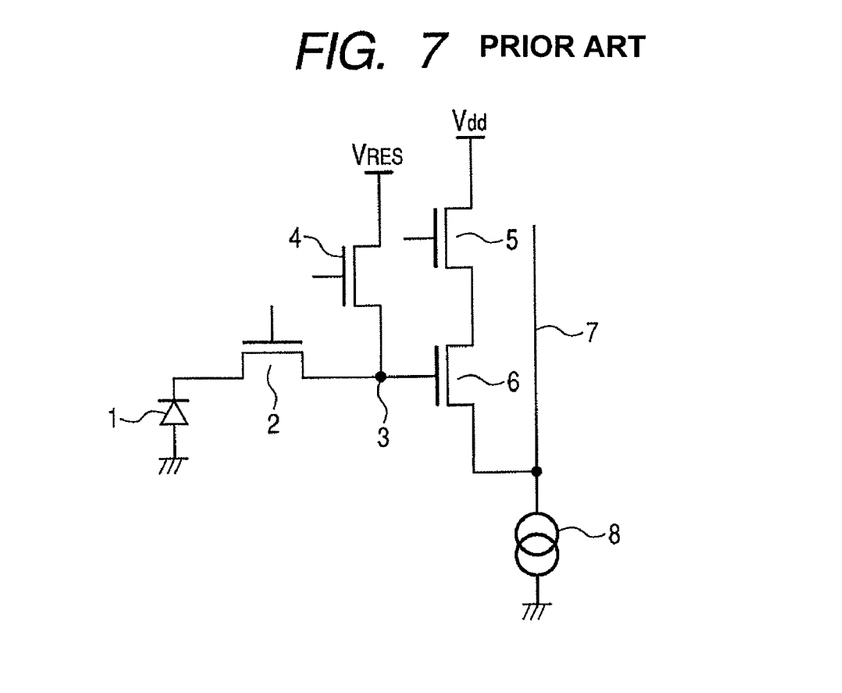
FIG. 7 is a circuit block diagram of the pixel of a solid state image pick up device mounted with a conventional CMOS sensor.

FIG. 7 is one example of a circuit block diagram of a solid state image-pick up device mounted with the CMOS sensor.

In FIG. 7, reference numeral 1 a photo diode (hereinafter referred to as [PD]) which converts a light into a signal charge, reference numeral 2 a transfer MOS transistor for transferring a signal charge generated in the PD, reference numeral 3 a floating diffusion region (hereinafter referred to as FD) for temporarily storing a transferred signal charge, reference numeral 4 a reset MOS transistor for resetting the FD3 and PD 1, reference numeral 5 a select MOS transistor for selecting an random line among an array, reference numeral 6 a source follower MOS transistor for converting the voltage of the signal charge of the FD3 and amplifying it by a source follower type amplifier, reference numeral 7 a reading out line which is used in common by a column for reading out a pixel voltage signal, and reference numeral 8 a constant current source for turning the reading out line 7 into a constant current. Although not shown, either or both of a circuit for processing a signal from this pixel and a drive circuit (shift resistor) for driving the transistor in the pixel are formed as a peripheral circuit in the same substrate.

Each pixel (except for the constant current source 8) is disposed in an array pattern, and constitutes an image pick up device.

Figure 8:
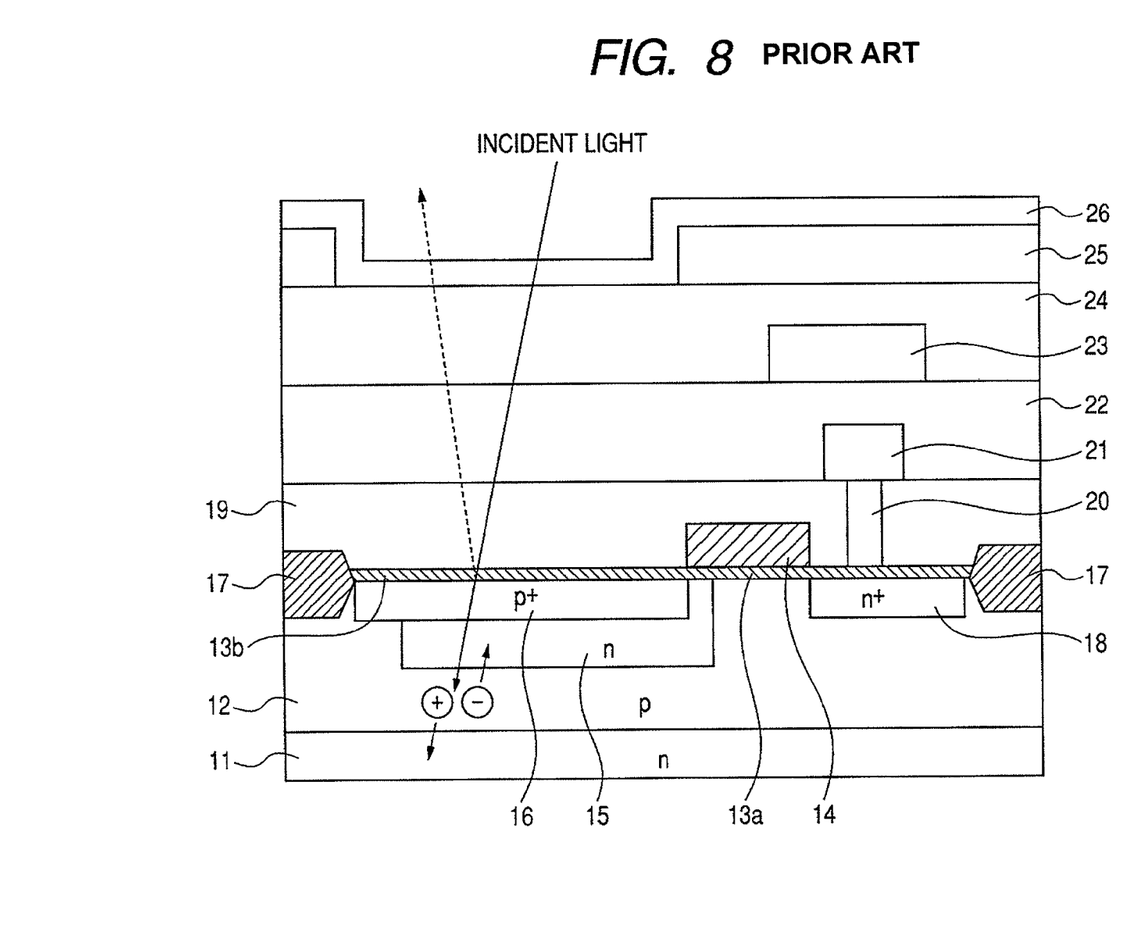
FIG. 8 is a schematic sectional view of the pixel of the solid state image pick up device mounted with the conventional CMOS sensor.

FIG. 8 is a schematic sectional view of the pixel of the image pick up device mounted with the CMOS sensor, and in particular, it is a view showing a portion of the PD 1 and the transfer MOS transistor 2 in FIG. 7. Reference numeral 11 denotes an n-type silicon substrate, reference numeral 12 a p-type well, reference numeral 13a a gate oxide film of the MOS transistor, reference numeral 13b a thin oxide film on a light receiving portion, reference numeral 14 a gate electrode of the transfer MOS transistor 2, reference numeral 15 an n-type anode of the PD1 (the n-type mode 15 is the same conductivity type as a signal charge and operates to storage and transfer the signal charge), reference numeral 16 a surface p-type region for turning the PD 1 into a berried structure, reference numeral 17 a select oxide film for separating pixels, reference numeral 18 an n-type high concentration region which forms a FD 3 and serves as a drain region of the transfer MOS transistor 2, reference numeral 19 a silicon oxide film for insulating the gate electrode 14 and a metal first layer 21, reference numeral 20 a contact plug, reference numeral 22 an interlayer insulation film for insulating the meal first layer 21 and a metal second layer 23, reference numeral 24 a interlayer insulation layer for insulating the second metal layer 23 and a third metal layer 25, and reference numeral 26 a passivation film. In a color photoelectric conversion device, on the upper layer of the passivation film 26, there are further formed a color filter layer not shown, and also a micro lens for sensitivity improvement. A light incident from the surface passes through an opening portion having no metal third layer 25, and enters the PD. The light is absorbed inside the n-type anode 15 of the PD or the p-type well 12, and generates electron-hole pairs, among which the electrons are stored in the n-type anode 15.

Further, as features of the CMOS sensor, there is cited an advantage of a conventional CMOS process being utilizable, since, in a pixel portion, a PD formation well for forming a light receiving region and a peripheral circuit formation well for forming a drive device are the same conductive type. That is, the utmost features of the CMOS sensor are that, unlike a CCD, no specific production line is required, but that a low cost solid image pick up device can be produced by using an existing semiconductor production line.

FIGS. 11A to 11D and 12A to 12C are views showing each of the well forming methods of the conventional CMOS sensor using an ordinary COMS process.

Here, an example of using the n-type silicon substrate is shown.

Figure 11A:
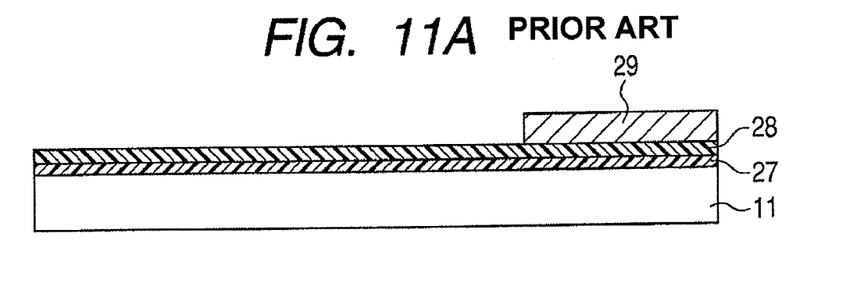
FIGS. 11A, 11B, 11C, and 11D are views showing a portion of each well forming method of a conventional CMOS sensor using an ordinal CMOS process.
Figure 11B:
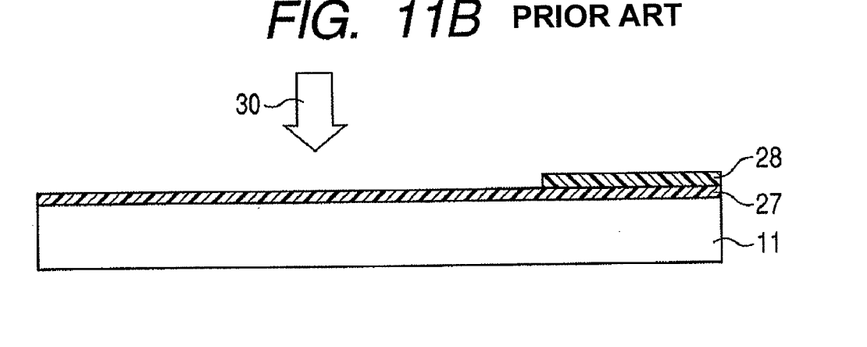

First, a silicon thermally oxidized film 27 and a silicon nitride film 28 are formed on the n-type silicon substrate 11 (FIG. 11A).

Figure 11C:
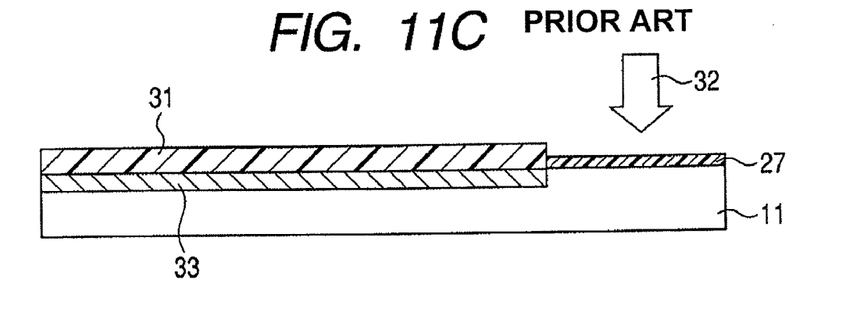

After removing the silicon nitride film 28 of a desired region by the pattern of a photo resistor 29, a p-type impurity 30 is introduced (FIG. 11B) by ion implantation. After removing the photo resistor 29, when thermally oxidization processing is performed, a silicon oxidized film 31 is formed in the region alone, into which the p-type impurity 30 is introduced. Next, the silicon nitride film 28 is removed, and an n-type impurity 32 is introduced by ion implantation (FIG. 11C). At this time, since there is formed the oxidized film 31 on the region into which the p-type impurity 30 is introduced, the n-type impurity 32 is formed in a region other than the region where the p-type impurity 30 is formed self-align wise. Naturally, the oxidized film 31 is formed by a thick film so as not to be pierced at the implantation time of the n-type impurity 32.

Figure 11D:
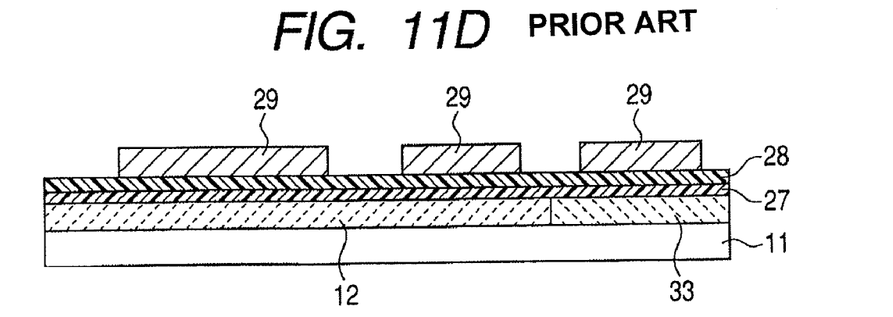

As described above, after introducing the p-type impurity 30 and the n-type impurity 32 into the desired region, a thermo diffusion processing is performed so as to obtain a desired depth and a concentration profile (hereinafter referred to as [impurity profile]), thereby forming a p-type well 12 and an n-type well 33 (FIG. 11D).

Figure 12A:
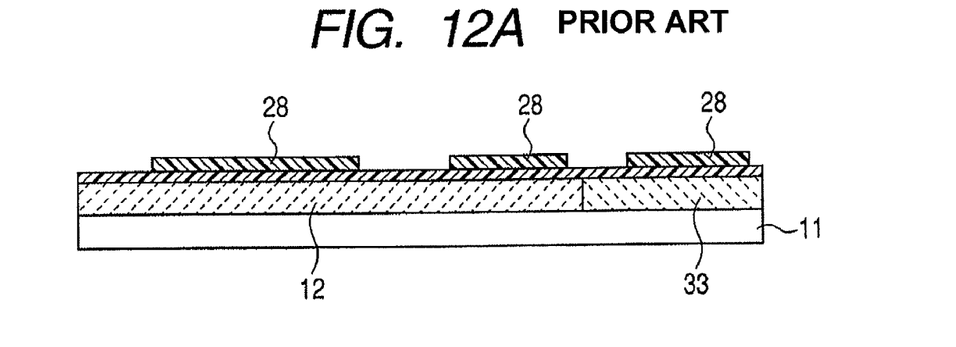
FIGS. 12A, 12B, and 12C are views showing a portion of each well forming method of the conventional CMOS sensor using the ordinal CMOS process.

Subsequently, after removing all the oxidized films once, the silicon thermal oxidized film 27 and the silicon nitride film 28 are formed again, and the desired region is subjected to patterning by the photo resistor 29, and the silicon nitride film 28 is subjected to an etching (FIG. 12A).

Figure 12B:
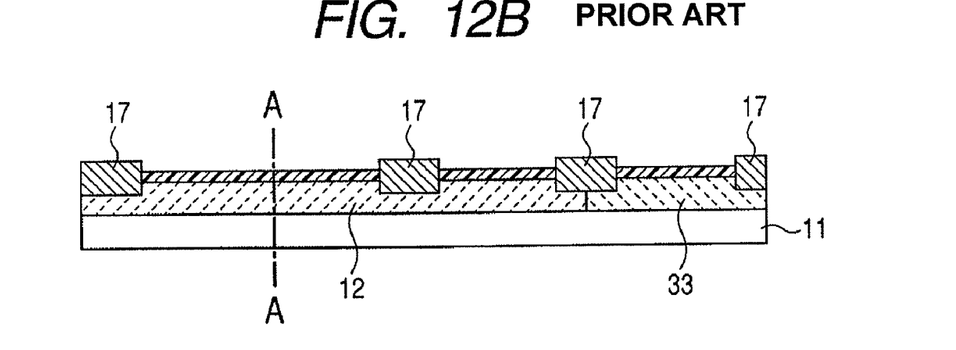

Finally, after performing electrical isolation by the select oxidized film 17, each well region for forming a MOS transistor, a resistor, a capacitor, a diode and the like is formed (FIG. 12B).

Figure 12C:
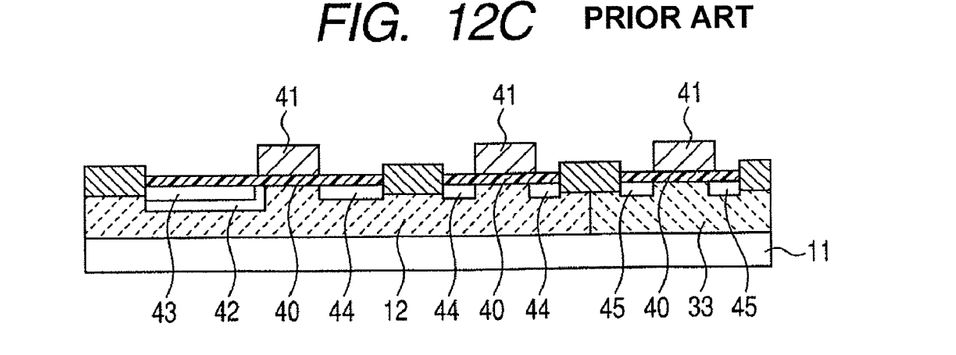

After that, a gate oxidized film 40 and a gate electrode 41 of the MOS transistor are formed, and an n-type region 42 of the PD and a p-type region 43 of the surface are formed, and a source/drain 44 of the NMOS transistor and a source/drain 45 of the PMOS transistor are formed, and after going through a wiring forming process (not shown), the solid state image pick up is completed (FIG. 12C).

Further, FIG. 12B shows from the left in order that a PD forming p-type well, a peripheral circuit p-type well, and a peripheral circuit n-type well are formed by the select oxidized film 17, and there is an advantage of being able to adopt an easy process at a low cost by the minimum photolithographic process and a self-aligning well forming method.

Further, though it is not the conventional CMOS process, as shown in Japanese Patent Application Laid-Open No. 2000-232214, there has been also proposed a method of controlling the impurity profile by providing a buried type epitaxial region in the PD region.

Further, in Japanese Patent Application Laid-Open No. H01-243462, there has been disclosed a solid state image pick up device comprising plural photoelectric conversion pixels and scanning means for reading out a signal of this photoelectric conversion pixel, wherein the photoelectric conversion pixel is formed inside an impurity layer of concentration lower than the impurity layer by which scanning means is formed. This makes it possible to miniaturize a MOS transistor by forming a scanning circuit in a high concentration impurity layer according to a proportion reduction rule. In addition, it has been disclosed that, by forming a photoelectric conversion portion inside a low concentration impurity layer, a depletion layer on the periphery of a photo diode is expanded so as to improve a light sensitivity.

Further, in U.S. Pat. No. 6,445,014, there is a description with regard to a periphery well in which a logical circuit is formed and a well in which a pixel cell is formed. To be more in detail, a constitution is disclosed, wherein the well in which the pixel cell is formed is taken as a retrograde well, and the impurity concentration of the periphery well is reduced from the top toward the bottom of the well (see FIG. 12 of the U.S. Publication). Further, the impurity concentration is $1 \times 10^{16}$ to $2 \times 10^{18}$ atoms per $cm^3$, and is taken as the same value. Further, with regard to depth of the well to be formed, the well which forms a PD region is deeper (see FIG. 11 of the U.S. Publication).

As described above, though the CMOS solid state image pick up device has an advantage of being able to use the existing CMOS forming manufacturing method, there are some problems involved in order to improve an imaging performance.

A first problem is that the impurity amount to be introduced to the peripheral circuit well region of the same conductive type as the PD well region is made the same as shown in the prior art (FIG. 11B), and for example, in this prior art, the impurity concentrations of the PD well region and the peripheral circuit p-type well region cannot be set separately. For example, to improve spectral characteristics of an incident light, it is not possible to diminish the impurity concentration alone of the PD well nor is it remarkably easy to control a threshold value setting and the like of the MOS transistor provided inside the PD well without changing the concentration of the p-type peripheral circuit well.

A second problem is that the thermal diffusion processing after the introduction of the impurity into each of the PD well region and the peripheral circuit well region is often collectively performed as shown in (FIG. 11D). Hence, it is not possible in principle to control the depth alone of the impurity profile of the PD well region, and so the impurity profile of the peripheral circuit well must be changed each time to improve the characteristics of the CMOS sensor, and this causes a great inconvenience in terms of the design.

Further, according to the constitution disclosed in Japanese Patent Application Laid-Open No. H01-243462, there is a point to be examined as follows. That is, in the constitution where the concentration of the well to form the peripheral circuit is made high, the efficiency of collecting the charge in the photoelectric conversion portion may not be sufficiently achieved. This often grows to a greater problem to be solved as the pixel becomes miniaturized and the sensitivity thereof is reduced.

Further, according to the constitution disclosed in U.S. Pat. No. 6,445,014, there is a point to be examined as follows. That is, though the depth of the well and the structure of the well are made different from the photoelectric conversion well and periphery well, since the impurity concentrations thereof are made the same, as described above, the efficiency of collecting the charge in the photoelectric conversion portion is often not sufficiently achieved.

Hence, an object of the present invention is to provide a photoelectric conversion device able to realize a PD well structure, which contributes to the improvement of an imaging performance, while using the existing CMOS manufacturing method.

DISCLOSURE OF THE INVENTION

As means to achieve the above described object, the present invention proposes to independently control and form the impurity profile of the same conductive type peripheral circuit well as the PD well.

Hence, the present invention, in the photoelectric conversion device wherein a pixel including a photoelectric conversion device for converting a light into a signal charge and a peripheral circuit including a circuit for processing the signal charge outside the pixel region in which the pixel are disposed on the same substrate, is characterized by comprising:

a first semiconductor region of a first conductivity for forming the photoelectric conversion device, the first semiconductor region being formed in a second semiconductor region of a second conductivity type; and a third semiconductor region of the first conductivity type and a fourth semiconductor region of the second conductivity type for forming the peripheral circuit, the third and fourth semiconductor region being formed in the second semiconductor region; and wherein the impurity concentration of the first semiconductor region is higher than the impurity concentration of the third semiconductor region.

Further, in the photoelectric conversion device, the first semiconductor region is characterized by comprising plural impurity regions, wherein each of the plural impurity regions has a peak of the impurity concentration.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

BEST MODE FOR CARRYING OUT THE INVENTION

Next, embodiments of the present invention will be described with reference to the drawings. A well used in the description here indicates a region where a desired conductive type impurity is diffused, and no restriction is imposed on its manufacturing method. It has the same function as a semiconductor region.

FIRST EMBODIMENT

FIGS. 1A to 1D, and 2A to 2C are views showing a well forming method of a CMOS sensor in a first embodiment of the present invention, particularly forming method of a PD formation well and a peripheral circuit formation well.

Here, the PD formation well includes, in addition to a PD, a pixel circuit such as a transfer MOS transistor, a FD, a reset MOS transistor, a select MOS transistor, a source follower MOS transistor for amplifying a signal, and the like. Further, inside the peripheral circuit formation well, there are formed a circuit for processing a signal from the pixel, a drive circuit for driving the transistor inside the pixel, and the like.

Figure 1A:
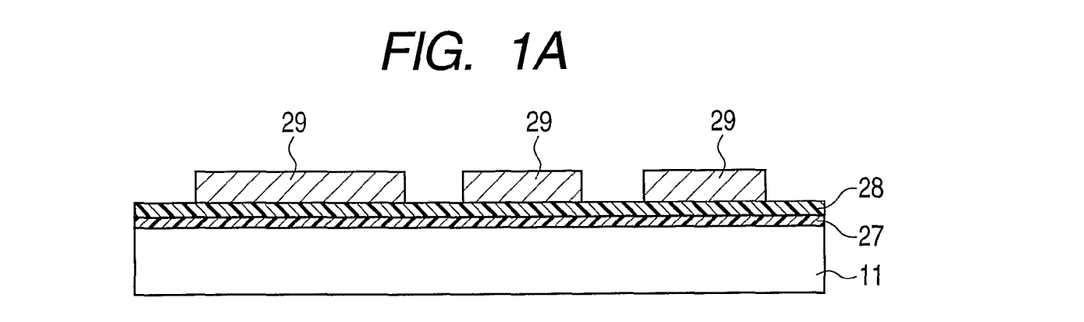
FIGS. 1A, 1B, 1C and 1D are views showing a portion of a well forming method of a CMOS sensor in a first embodiment of the present invention.
Figure 1B:
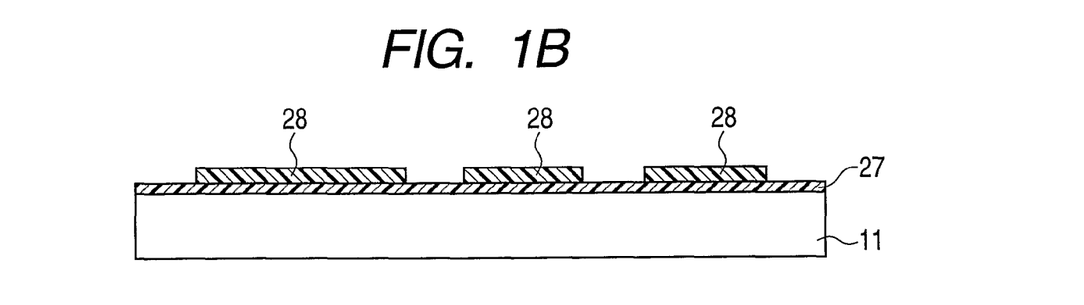

First, on an n-type silicon substrate 11, there are formed a silicon thermally oxidized film 27 and a silicon nitride film 28, which becomes a mask, and a desired region is subjected to patterning by a photo resistor 29 (FIG. 1A).

Figure 1C:
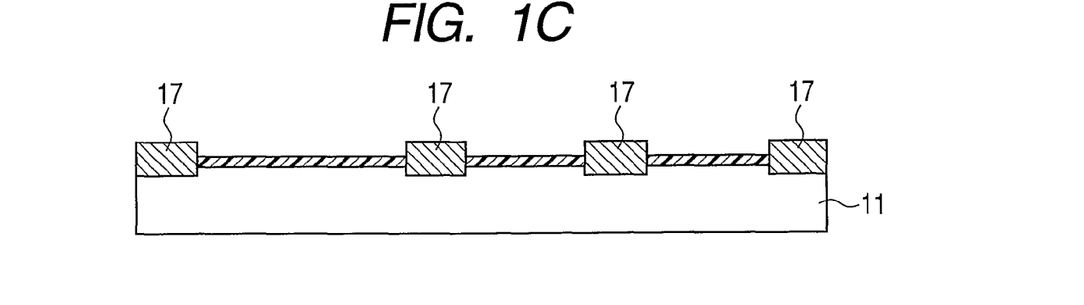

Next, the silicon nitride film 28 is subjected to patterning by a dry etching (FIG. 1B), and a select oxidized film 17 is formed by thermal oxidation, and the nitride film is removed, and each well region sectionalized by the select oxidized film is secured (FIG. 1C).

Figure 1D:
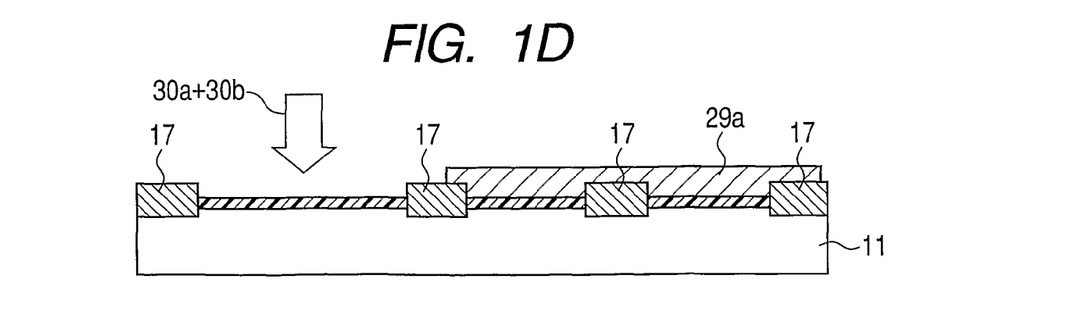

Next, the region alone which becomes the PD formation well is subjected to patterning by a photo resistor 29a, and a desired p-type impurities 30a and 30b are introduced by ion implantation (FIG. 1D). Since the p-type impurities 30a and 30b are introduced into the PD region alone, a dose amount, an acceleration speed, and moreover, the number of times of ion implantation, and the like are allowed to be set at random, and a thickness of the resist 29a is decided so as to become a mask material of the maximum acceleration energy. Further, though not illustrated, after performing a resist removing subsequent to implantation of the p-type impurities 30a and 30b, naturally, a heat treatment can be freely given to obtain a desired profile.

Figure 2A:
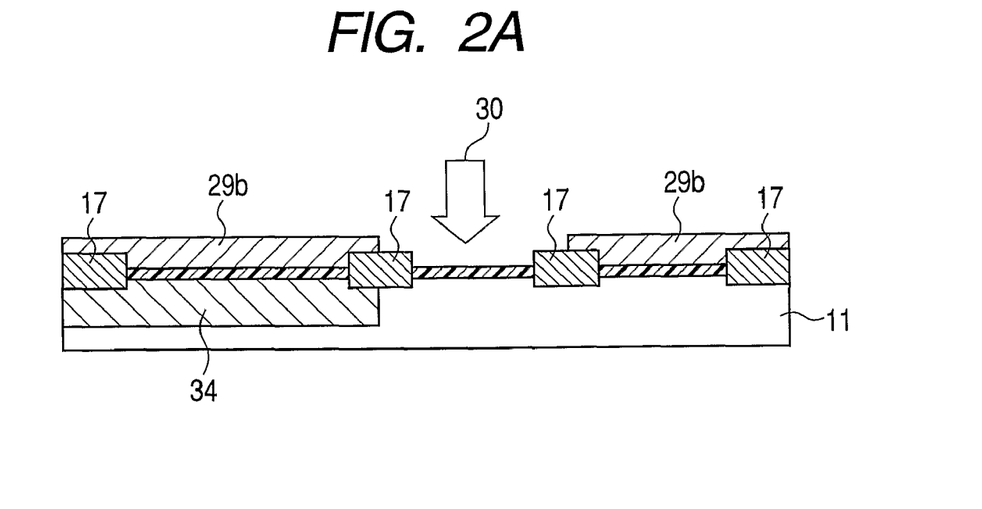
FIGS. 2A, 2B, and 2C are views showing a portion of the well forming method of the CMOS sensor in the first embodiment of the present invention.
Figure 2B:
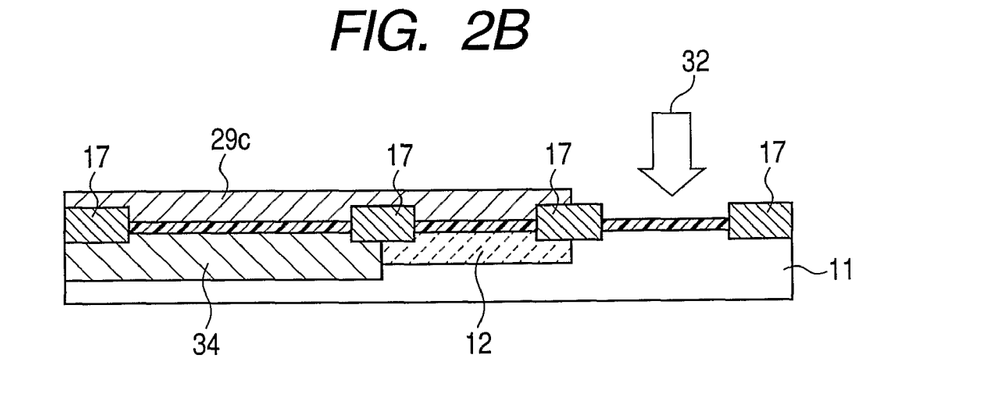

After having set the impurity profile of the well region for forming the PD in this manner, this time, the peripheral circuit p-type well region alone is subjected to patterning by a photo resist 29b, and a p-type impurity 30 is introduced (FIG. 2A). Next, by a photo resist 29c, an n-type impurity 32 is sequentially introduced into a peripheral circuit n-type well region by the same method (FIG. 2B). Finally, for optimization of the impurity profile of each well, a desired heat treatment is performed, thereby forming a PD well 34, a peripheral circuit p-type well 12, and an n-type well 33 (FIG. 2C).

When the method of the present embodiment is used in this manner, an optimum well structure can be designed for each well.

Figure 2C:
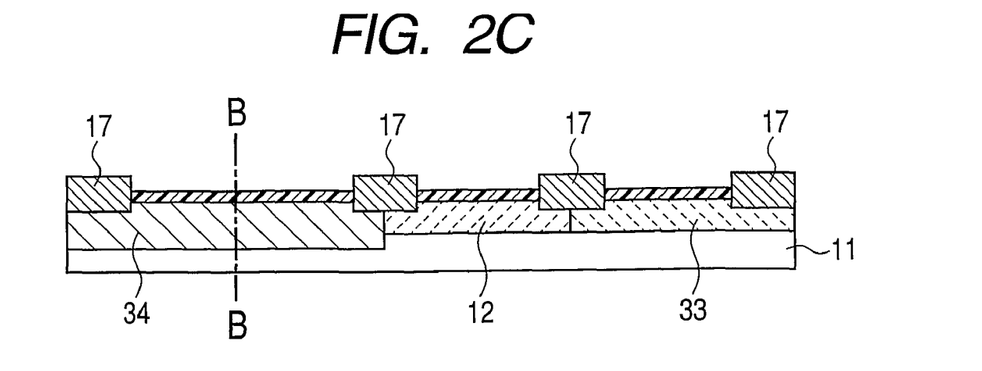
Figure 3:
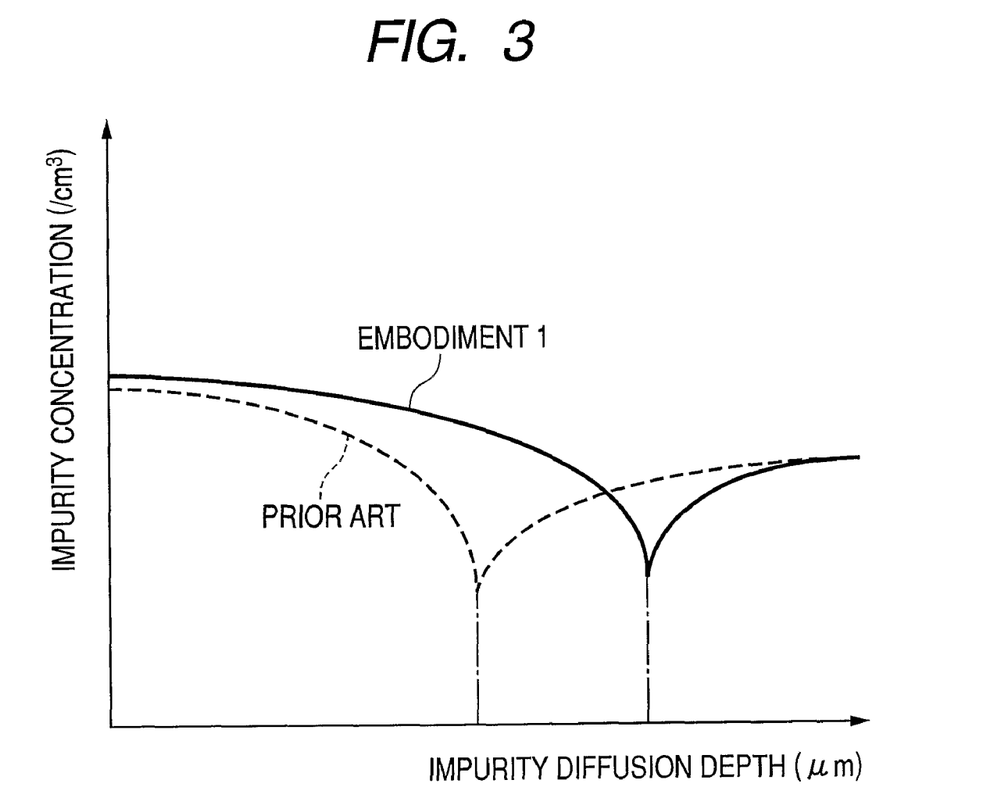
FIG. 3 is a schematic illustration of an impurity profile of a PD well region in the first embodiment of the present invention.

FIG. 3 is a schematic illustration of the impurity profile cut along the line B-B of FIG. 2C, which is obtained in the case where the impurity profile of the PD well region in the present embodiment, particularly the above described PD well region is subjected to patterning, and after that, the p-type impurity 30a is subjected to ion implantation plural times by energy of 5E11 to 1E13 atom/cm$^2$, and 40 to 700 keV, and the p-type impurity 30b by energy of 2E11 to 1E14 atom/cm$^2$, and 700 keV to 2.7 MeV, and then, both the impurities are treated with a drive process at temperatures of 1000 to 1200° C. and under N$_2$ atmosphere for 0.5 to 6 hours.

The p-type impurities 30a and 30b may be of the same material or of a different material, and if the impurities are of the different material, the introduction by ion implantation is performed with a time shifted.

Further, the impurity profile cut along the section A-A of the PD well region shown in the prior art (FIG. 12B) is shown by a broken line in the drawing, and it can be seen that the present embodiment has a deeper p-type impurity profile comparing to the prior art and the peripheral circuit formation p-type well. By this diffusion depth, a light carrier entering the PD well, particularly having a spectral sensitivity having a deep infiltration length in a long wavelength region can be much more improved.

Further, the PD formation well and the peripheral circuit formation well are constituted to be lower in the impurity concentration at the substrate deep part side, comparing to a semiconductor substrate surface side. The impurity concentration of the periphery circuit forming well is lower in the impurity concentration, comparing to the PD formation well, and the depth of the well is formed so as to become shallow. In this manner, the collecting efficiency of the charge of the PD is improved, and moreover, the production efficiency of the device can be improved.

Here, with regard to the place in which the impurity concentrations of both wells are compared, it is a place sufficiently far away from the diffusion region for forming a source drain region of the MOS transistor, wherein, for example, the concentration may be compared at a place down below the gate electrode and the source drain region and at the same depth from the substrate surface.

Further, in the present embodiment, since the heat treatment is performed under the same heat treatment condition at the well forming time, both the PD region and the peripheral circuit region have not a clear-cut impurity concentration peak, and have the same concentration at almost all the portions, and therefore, the impurity concentration may be compared in both the PD region and the peripheral circuit region.

SECOND EMBODIMENT

FIGS. 4A to 4E and 5A to 5C are views showing a well forming method of a CMOS sensor, particularly a forming method of a PD well and a peripheral circuit well structure in a second embodiment.

Figure 4A:
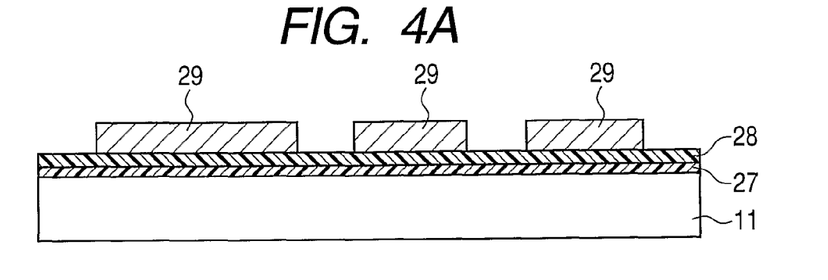
FIGS. 4A, 4B, 4C, 4D, and 4E are views showing a portion of the well forming method of the CMOS sensor in a second embodiment of the present invention.
Figure 4B:
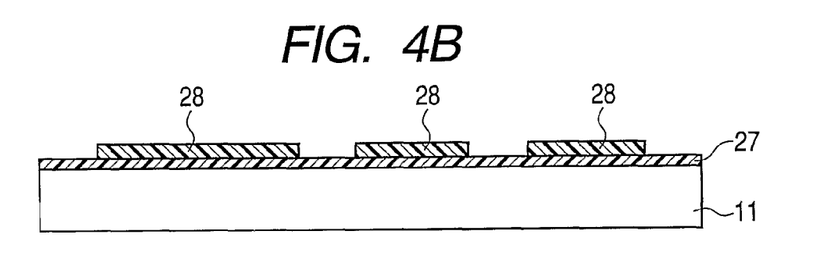
Figure 4C:
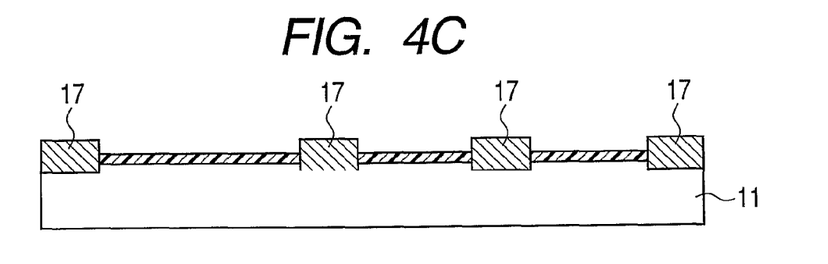

FIGS. 4A to 4C are the same as the first embodiment.

Figure 4D:
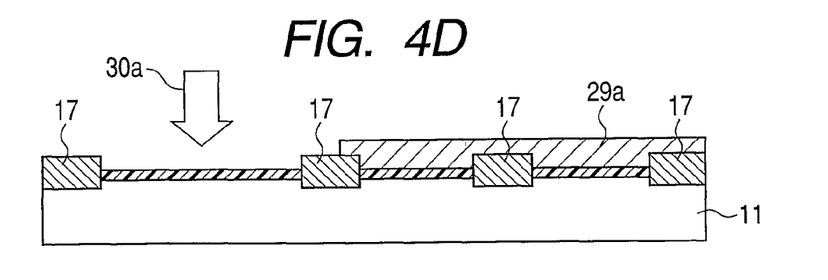

In the present embodiment, a resist patterning 29a is performed in a region alone which becomes a PD formation well, and a desired p-type impurity 30a is introduced by ion implantation similarly under the same condition as the first embodiment.

Since the p-type impurity 30a is introduced into the PD region alone, a dose amount, energy or the number of times of ion implantation, and the like are allowed to be freely set.

Figure 4E:
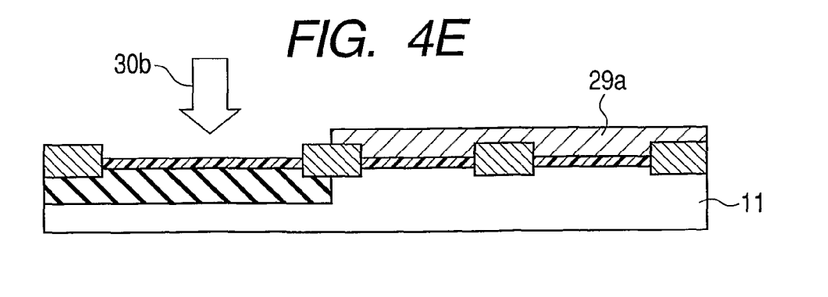

Further, together with acceleration energy, the thickness of the resist 29a as a mask material can be adjusted. Further, in the present embodiment, as shown in FIGS. 4D and 4E, ion implantation is performed plural times separately. Subsequent to the ion implantation, a shallow semiconductor region 35a is formed by heat treatment, and after that, a deep semiconductor region 35a is formed next by ion implantation so that it may be taken as a PD formation well. The p-type impurities 30a and 30b may be of the same matter or of a different material. The impurity concentration peak of the deep semiconductor region 35b is preferably higher comparing to the impurity concentration peak of the 35a. This is for the 35b to function as a potential barrier to prevent a charge generated at the PD from leaking into a substrate and an adjacent pixel. Further, with regard to the 35a, the impurity concentration of the impurity concentration peak is preferably higher than the impurity concentration peak of the p-type well, which forms the peripheral circuit. In this manner, the transfer voltage (depleted voltage) at the signal transfer time from the PD to the FD can be controlled low.

Further, the p-type impurity region of the PD formation well has a common region with the p-type impurity region of the peripheral circuit well, and moreover, the p-type impurity region deeper than the p-type impurity region of the peripheral circuit well may be disposed in the PD well alone.

Figure 5A:
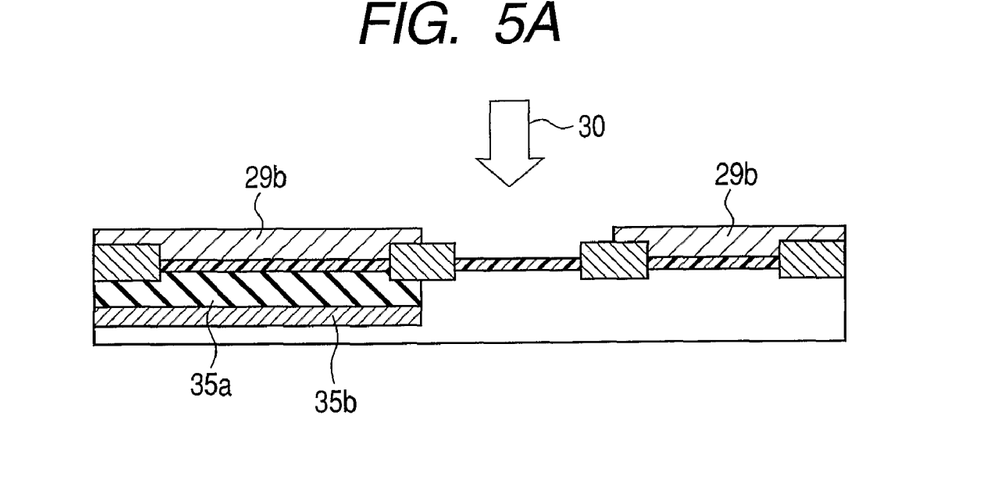
FIGS. 5A, 5B, and 5C are views showing a portion of the well forming method of the CMOS sensor in the second embodiment of the present invention.
Figure 5B:
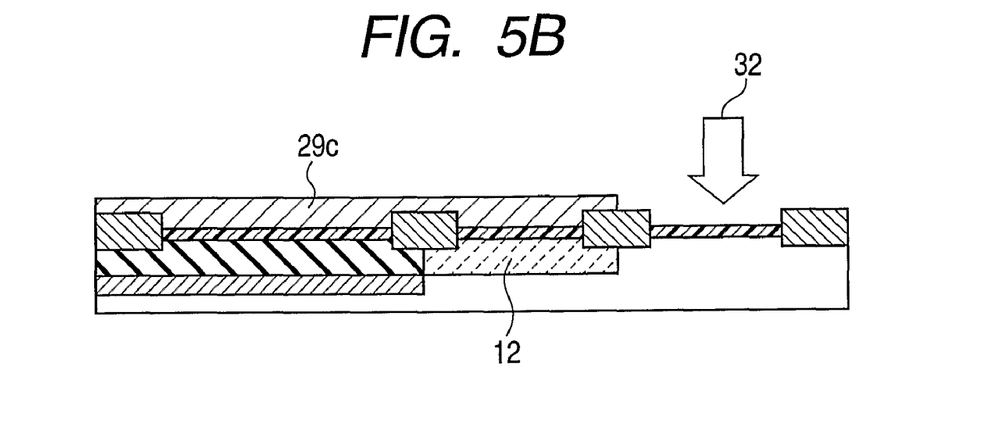

After that, subsequent to FIG. 5A, it is the same production flow as subsequent to FIG. 2A.

Figure 5C:
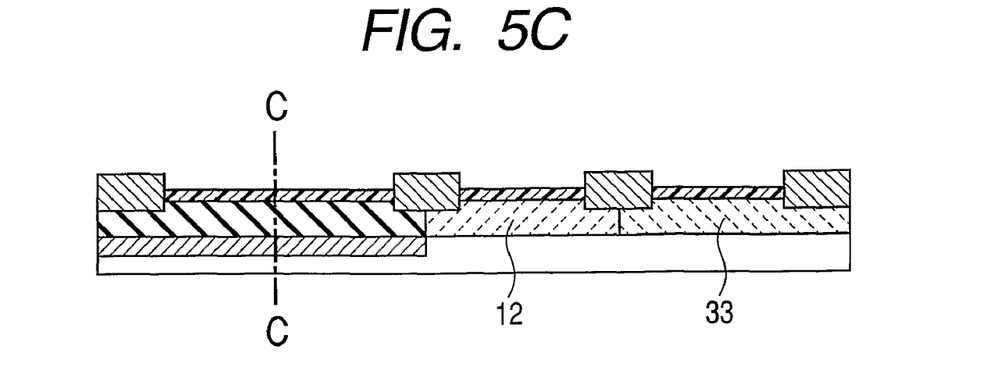
Figure 6:
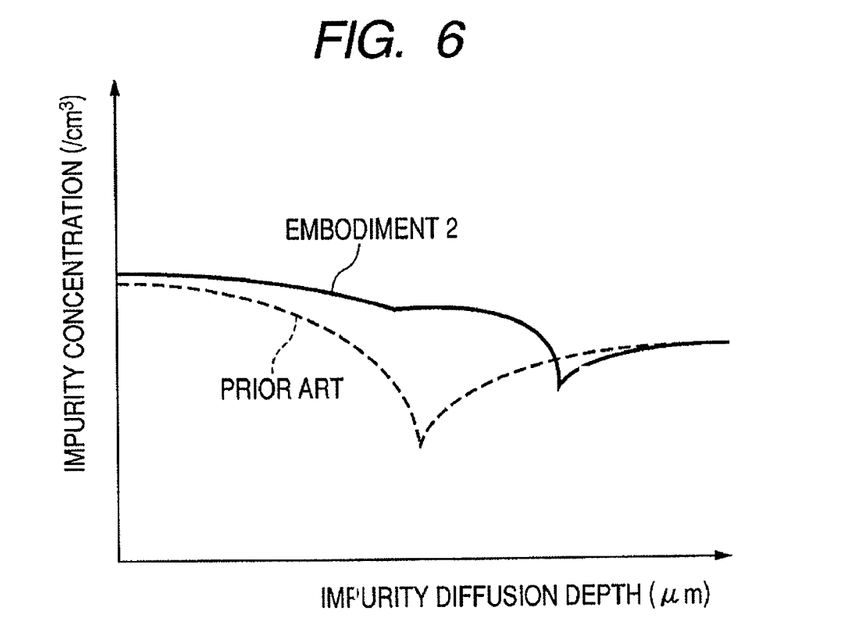
FIG. 6 is a schematic illustration of an impurity profile of the PD well region in the second embodiment of the present invention.

FIG. 6 is a schematic illustration showing the impurity profile of the PD well, particularly the impurity profile cut along the section C-C in FIG. 5C in the present embodiment.

The impurity profile cut along the section A-A of the PD well region shown in the prior art (FIG. 12B) is shown by a broken line in the drawing.

The p-type impurity region of the PD well comprises plural impurity regions having an impurity concentration peak, and the concentration of the deepest p-type impurity region is higher than the concentration of the next deepest p-type impurity region.

As shown in the figure, when there exists the peak of a deep diffusion layer corresponding to the 35b in the deep diffusion region, since the charge generated in the region shallower than this peak effectively reaches the PD of the surface side due to potential difference of the p-type diffusion layer, the sensitivity can be improved much more.

A Table 1 is a table comparing the embodiments in the present invention to the PD sensitivity of the prior art by actual measurement, and shows that PD sensitivity of the present embodiment is improved by 10 percent or more comparing to the prior art, and shows effectiveness of the present embodiment.

TABLE 1

| | PRIOR ART | FIRST EMBODIMENT | SECOND EMBODIMENT |
|---|---|---|---|
| RELATIVE SENSITIVITY COMPARISON | 1.00 | 1.10 | 1.16 |

Naturally, the pixel structure using the first embodiment and the second embodiment as shown above can be applied to FIGS. 7 and 8 shown earlier. Further, the method of the present embodiment not only can avoid a risk such as an autodoping effect, a crystal defect, and the like which generates at the time of an epitaxial growth for the process (Japanese Patent Application Laid-Open No. 2000-232214) using the buried type PD, but also makes it possible to design an ideal PD well shown in FIG. 2C in the first embodiment or FIG. 5A in the second embodiment totally independent from the peripheral circuit region by unrestricted combination of the ion implantation and the ordinary heater treatment.

THIRD EMBODIMENT

The point in which the present embodiment is different from the first and second embodiments is that a well by which a PD is formed is constituted by plural impurity regions having an impurity concentration peak, and a peripheral circuit formation well is also constituted by plural impurity regions having the impurity concentration peak. The forming process can be formed by the same step as the process shown in FIGS. 4A to 4E and 5A to 5C. However, an implantation step of the impurity 31 is performed by different acceleration voltage and dose amount.

Figure 9:
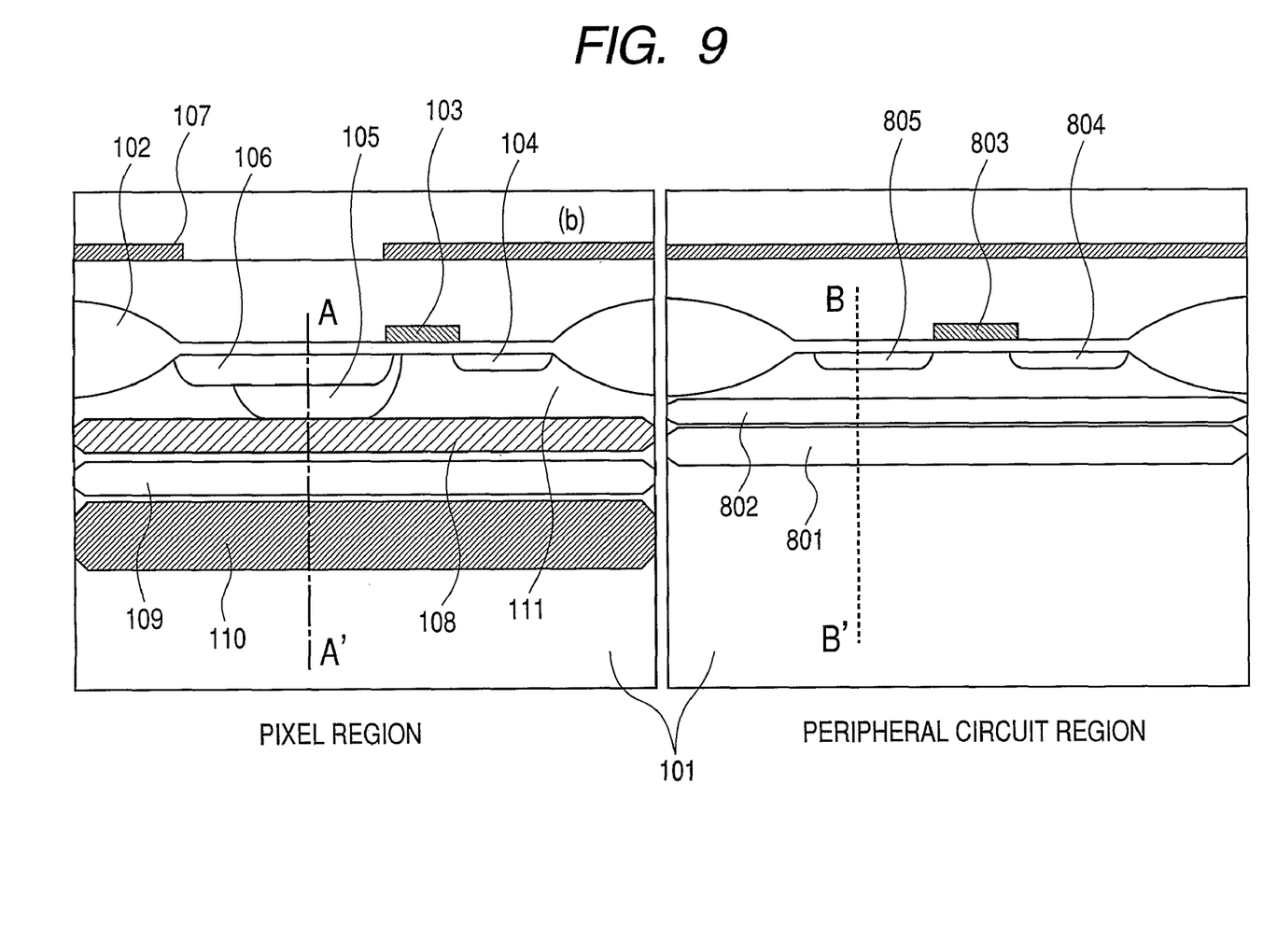
FIG. 9 is a schematic sectional view of a pixel portion and a peripheral circuit portion of the third embodiment.

A schematic sectional view of a PD formation region and a peripheral circuit formation region of the present embodiment will be shown in FIG. 9. In FIG. 9, reference numeral 101 denotes an n-type silicon substrate (semiconductor substrate). The n-type silicon substrate 101 is formed with p-type semiconductor regions 108 to 110 (first to third semiconductor regions) including regions having impurity concentration peaks in the n-type silicon substrate 101, and a substrate surface is formed with an element isolation region 102, a gate electrode 103 of a transfer transistor, a readout region 104, a storing region 105 (n-type semiconductor region of which conductivity type is the same as a signal charge, and which operates to storage and transfer the signal charge) of a photo diode, a surface p region 106 of the photo diode, and a p-type semiconductor 111. A light shielding layer 107 is provided with an opening portion, which shields a light toward the regions other than the photo diode. Further, reference numeral 801 denotes p-type semiconductor regions (fourth and fifth semiconductor regions) having impurity concentration peaks for forming the peripheral circuit. As evident from FIG. 8, the PD formation wells (first semiconductor region to third semiconductor region) are formed up to the depth of the substrate, comparing to the peripheral circuit formation well. Although to be described later, the impurity concentration peak concentration of the first semiconductor region 110 is set higher than the peak concentrations of the fourth and fifth semiconductor regions.

According to such a constitution, both the PD formation well and the peripheral circuit formation well can be formed into desired well profiles by the dose amount and the acceleration voltage at the time of the impurity ion implantation. Further, since the peak concentration of the first semiconductor region 110 formed at the substrate deep portion of the PD formation well can be set high, charge collection efficiency can be improved.

The impurity concentration profile of the well in which the PD is formed becomes a profile as shown in FIG. 9. The highest concentration of the impurity concentration peak is of the first impurity region 110 formed in the deepest location of the substrate, that is, the deepest portion of the substrate as compared to a light receiving surface, and the next highest concentration is of a second impurity region 108 in the vicinity of the well and an inverse conductive n-type region. The third impurity region 109 is lower in the impurity concentration peak than the impurity regions 108 and 110.

Next, the impurity concentration relation of each semiconductor region will be described. The reason of the impurity concentration peak concentration of the first semiconductor region being the most highest is that the charge generated in the deep portion of the substrate is not allowed to leak into the substrate side, but is made as a potential barrier to be used as a signal. The third semiconductor region 109 is formed at a low concentration compared to the first semiconductor region 110 in order to collect the signal charge generated in the vicinity of the first semiconductor 110 at the surface side. Further, the second semiconductor region formed close to the surface forms the impurity concentration higher comparing to the third semiconductor region 109, which has a function to control the width of a depletion layer in the joint with the storing region 105 of the photo diode. In this manner, a depleted voltage of the PD can be lowered, and a total reset and total transfer of the PD can be made without raising a potential for resetting the readout region 104. Further, a transfer gate voltage required for the reset and transfer of the PD, that is, an ON time voltage given to the gate electrode 103 of the transfer transistor can be made small, and a dynamic range can be secured without causing a rise of the power source voltage.

Figure 10:
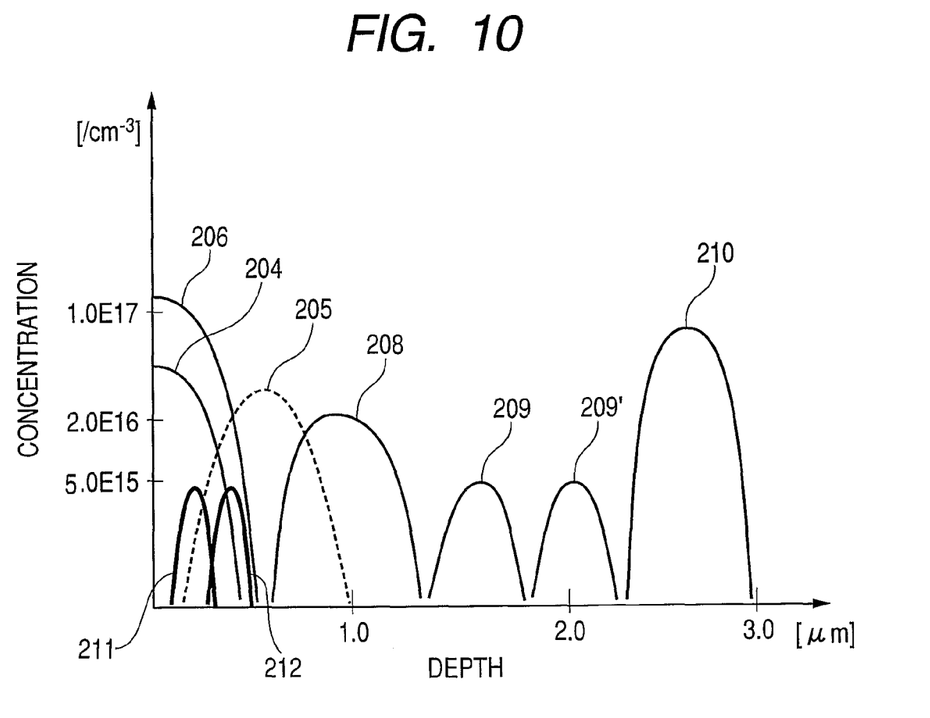
FIG. 10 is a view showing a concentration profile in FIG. 9.

FIG. 10 is an explanatory drawing of concentration profiles in a vertical direction of the PD portion, and shows concentration profiles cut along the lines A-A' and B-B' of FIG. 9. Reference numeral 206 shows a concentration profile of a surface p region of the photo diode, and corresponds to reference numeral 106 of FIG. 9. The concentration profile 206 can be formed by implantation of boron or fluoroboron. Reference numeral 205 denotes a concentration profile of the storing region of the photo diode, and corresponds to reference numeral 105 of FIG. 9. 205 can be formed by implantation of phosphor or arsenic. Reference numeral 208 denotes a concentration profile of the impurity region close to the storing region 205, and corresponds to reference numeral 108 of FIG. 9. Reference numerals 209 and 209' denote concentration profiles of an intermediate region, and correspond to reference numeral 109 of FIG. 9. In FIG. 10, an intermediate region is formed by having two stage peaks. In this manner, the present embodiment is effective also for the case where the concentration profile is formed by ion implantation of plural stages aligning with a desired structure. The concentration profiles 209 and 209' can be formed by double implantation of boron or fluoroboron. Reference numeral 210 denotes a concentration profile of the impurity region positioned at a location deeper than 208 and 209, and corresponds to reference numeral 110 of FIG. 9. A description on the p-type semiconductor region 111 will be omitted. Concentration profiles 211 and 212 correspond to reference numerals 801 and 802 of FIG. 9. As evident from FIG. 10, the impurity concentration peak concentration of the first semiconductor region 110 is higher than those of the fourth and fifth semiconductor regions 801 and 802. More preferably, the impurity concentration peak concentration of the second semiconductor region 108 is also set higher in impurity concentration peak than those of the fourth and fifth semiconductor regions. In this manner, as described above, the collection efficiency of charge can be improved, and moreover, the depleted voltage can be kept low.

Because of the above described functions, specific values of the peak concentration position and the peak concentration of each semiconductor region will be shown as follows. A first semiconductor region 210 has an impurity concentration peak concentration of $1 \times 10^{16}$ cm$^{-3}$ to $1 \times 10^{18}$ cm$^{-3}$, and the depth of the peak located is 2.0 μm to 4.0 μm from the substrate surface. A second semiconductor region 208 has a concentration of the impurity concentration peak of $2 \times 10^{15}$ cm$^{-3}$ to $2 \times 10^{17}$ cm$^{-3}$, and the depth of the peak located is 0.5 μm to 1.0 μm. The peak concentrations of third semiconductor regions 209 and 209' are $1 \times 10^{15}$ to $5 \times 10^{16}$ cm$^{-3}$, and it is effective to set the depth of the peak at 0.8 μm to 2.5 μm.

Further, the peak concentrations of fourth and fifth semiconductor regions are preferably set $1 \times 10^{16}$ cm$^{-3}$ to $1 \times 10^{18}$ cm$^{-3}$, and the depth of the peak is preferably set at 0.8 μm to 2.5 μm.

According to the constitution of the present embodiment thus described, both the PD formation well and the peripheral circuit formation well can be formed into desired profiles by the dose amount and the acceleration voltage at the time of the impurity ion implantation. Further, at this time, the peak concentration of the first semiconductor region 110 formed at the substrate deep portion of the PD formation well can be set higher than the peripheral circuit region, so that a charge collection efficiency can be improved.

(Application to Digital Camera)

Figure 13:
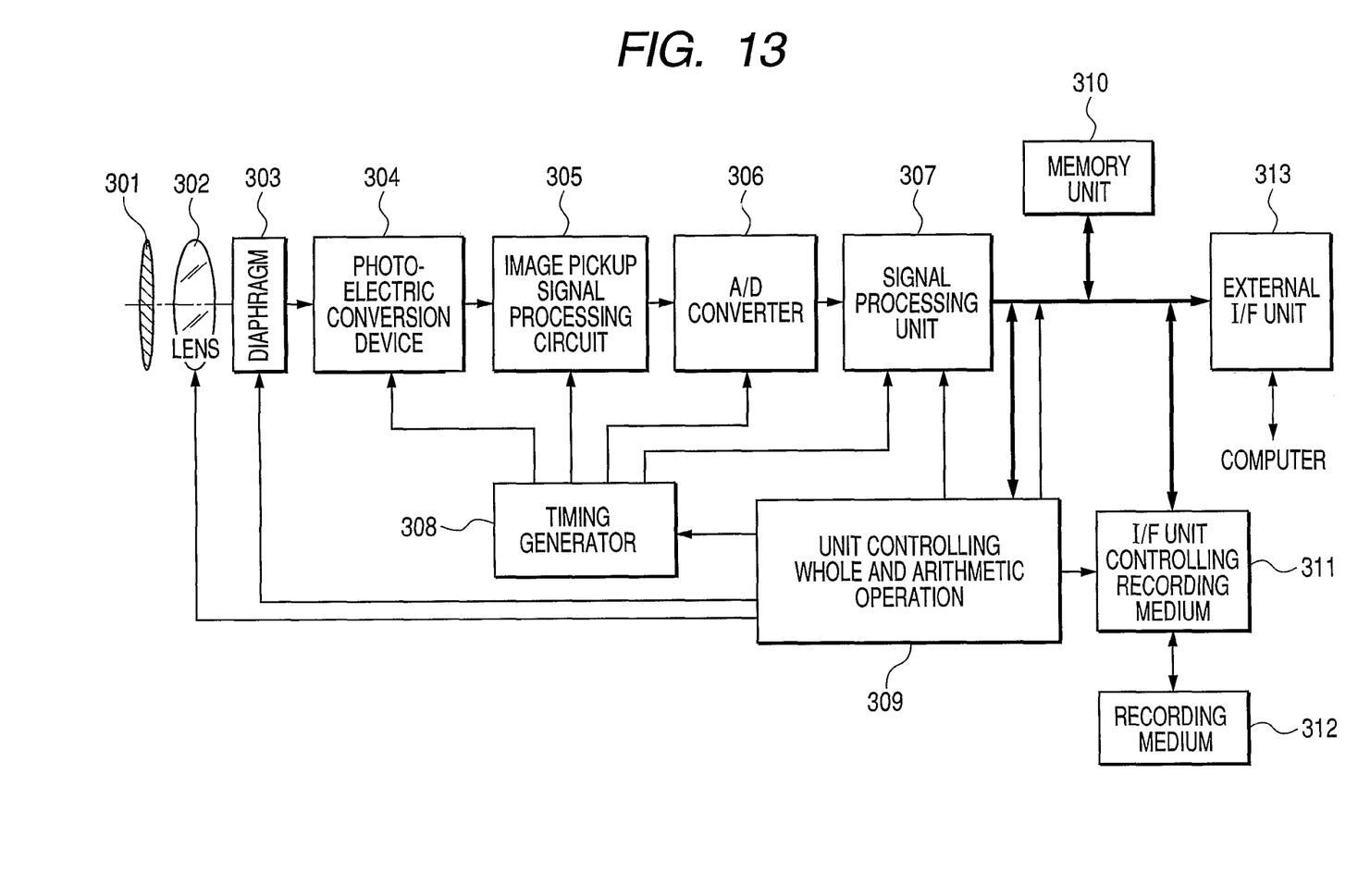
FIG. 13 is a view sowing an example of a circuit block in case of adapting the photoelectric conversion device in a third embodiment of the present invention to a camera.

FIG. 13 shows an example of a circuit block in case of applying a photoelectric conversion device according to the first to third embodiments of the present invention to a camera.

In front of an imaging lens 302, there is a shutter 301, which controls an exposure. A light, quantity is controlled by a diaphragm 303 as occasion demands, and an image of an object is imaged into a photoelectric conversion device 304. The photoelectric conversion device 304 uses the photoelectric conversion device of the present invention. The signal outputted from the photoelectric conversion device 304 is processed at an image pick up signal processing circuit 305, and is converted from an analogue signal to a digital signal by an A/D converter 306. The outputted digital signal is further subjected to an arithmetic processing at a signal processing unit 307. The processed digital signal is stored in a memory unit 310 or transmitted to external equipment through an external I/F 313. The photoelectric conversion device 304, the image pick up signal processing circuit 305, the A/D converter 306, and the signal processing unit 307 are controlled by a timing generator 308, and in addition, the whole system is controlled by a unit controlling whole and arithmetic operation 309. To record an image in a recording medium 312, the output digital signal is recorded through an I/F unit 311 controlling recording medium controlled by the unit controlling whole and arithmetic operation.

This application claims priority from Japanese Patent Application No. 2004-137411 filed on May 6, 2004, which is hereby incorporated by reference herein.

The invention claimed is:

1. A photoelectric conversion device comprising:

a plurality of pixels arranged in a pixel region, each pixel including a photoelectric conversion region for converting light into a signal charge, and a transfer transistor for transferring the signal charge from the photoelectric conversion region; and a peripheral circuit arranged outside of the pixel region and including a circuit for processing the signal charge, wherein the pixel region includes:

a first semiconductor region serving as a well of a first conductivity type disposed in the substrate of a second conductivity type that is opposite to the first conductivity type, a second semiconductor region of the second conductivity type disposed in the first semiconductor region, being a part of the photoelectric conversion region and accumulating the signal charge, and source and drain regions of the transfer transistor disposed in the first semiconductor region, wherein the peripheral circuit includes:

a third semiconductor region serving as a well of the first conductivity type disposed in the substrate, and source and drain regions of a transistor forming the peripheral circuit, wherein an impurity concentration of the first semiconductor region is higher than an impurity concentration of the third semiconductor region, and wherein the first semiconductor region extends deeper into the substrate than the third semiconductor region.

* * * * *